United States Patent
Tolt

(10) Patent No.: US 6,692,574 B1
(45) Date of Patent: Feb. 17, 2004

(54) GAS DISPERSION APPARATUS FOR USE IN A HOT FILAMENT CHEMICAL VAPOR DEPOSITION CHAMBER

(75) Inventor: Zhidan Li Tolt, San Jose, CA (US)

(73) Assignee: SI Diamond Technology, Inc., Austin, TX (US)

( * ) Notice: Subject to any disclaimer, the term of this patent is extended or adjusted under 35 U.S.C. 154(b) by 181 days.

(21) Appl. No.: 09/511,572

(22) Filed: Feb. 23, 2000

Related U.S. Application Data

(60) Provisional application No. 60/151,420, filed on Aug. 30, 1999.

(51) Int. Cl.[7] .................................................. C23C 16/00
(52) U.S. Cl. .............. 118/715; 118/723 R; 118/723 HC
(58) Field of Search .......................... 118/715, 723 R, 118/724, 723 HC; 156/345

(56) References Cited

U.S. PATENT DOCUMENTS

| | | | |
|---|---|---|---|
| 4,105,810 A | * | 8/1978 | Yamazaki et al. .......... 427/248 |
| 4,529,474 A | * | 7/1985 | Fujiyama et al. ........... 156/643 |
| 4,953,499 A | * | 9/1990 | Anthony et al. ............ 118/724 |
| 4,970,986 A | * | 11/1990 | Anthony et al. ............ 118/724 |
| 4,980,204 A | * | 12/1990 | Fujii et al. ................ 427/255.2 |
| 5,397,396 A | * | 3/1995 | Kosky et al. ............... 118/924 |
| 5,437,728 A | * | 8/1995 | Anthony et al. ............ 118/724 |
| 5,500,256 A | * | 3/1996 | Watabe ....................... 427/579 |
| 5,833,753 A | * | 11/1998 | Herlinger et al. ........... 118/724 |
| 6,161,499 A | * | 12/2000 | Sun et al. ................ 118/723 E |
| 6,200,387 B1 | * | 3/2001 | Ni .............................. 118/722 |

* cited by examiner

Primary Examiner—Luz Alejandro-Mulero
(74) Attorney, Agent, or Firm—Winstead Sechrest & Minick P.C.

(57) ABSTRACT

A carbon deposition chamber is provided with several advantages. The gas mixture used within the deposition process is expressed from tubing through three zones, which are each individually determined with needle valves. The substrate is permitted to rotate back-and-forth to permit more even deposition of carbon films onto the substrate. The heating filaments are permitted to expand and contract without breakage by permitting the electrode attached to one end of the filaments to move freely as the filaments change in length. The substrate and the heating filaments are cooled to a temperature to prevent carbonization by permitting a cooling fluid to be passed through tubing connected to these elements in a heat sink like manner.

17 Claims, 7 Drawing Sheets

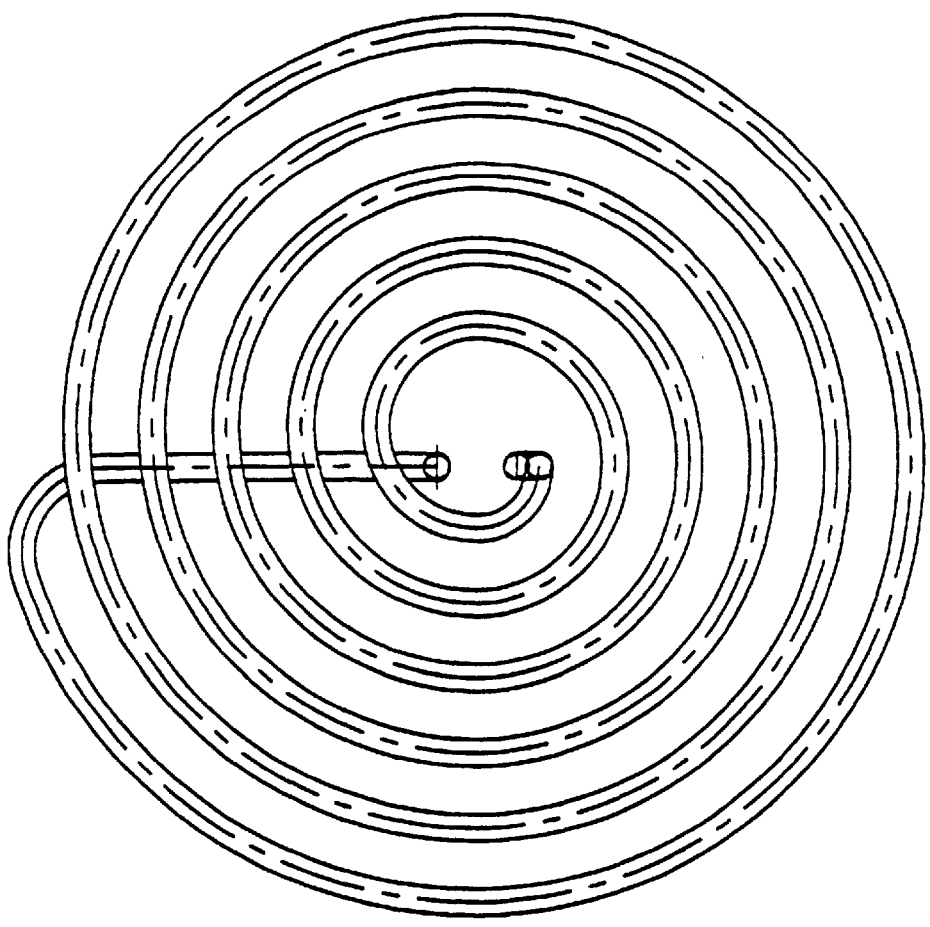
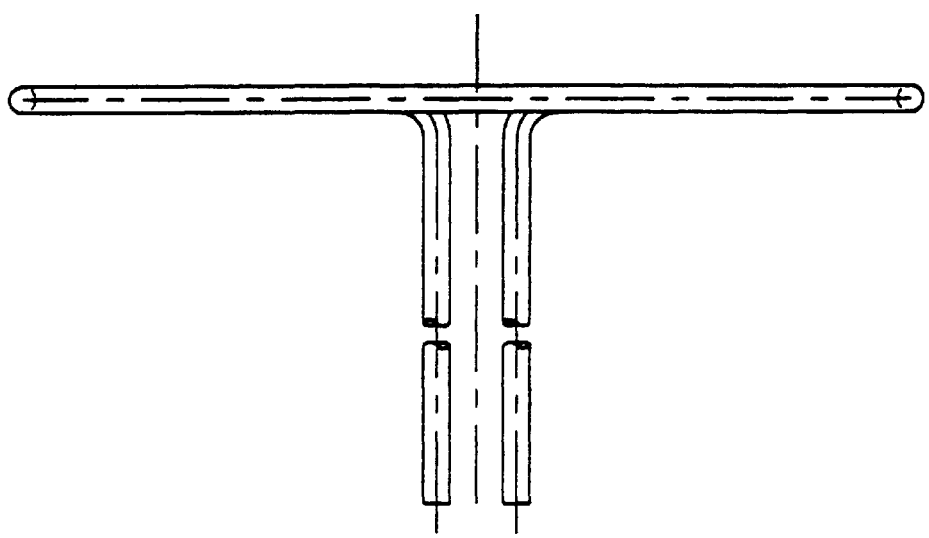
FIGURE 7

GAS DISPERSION APPARATUS FOR USE IN A HOT FILAMENT CHEMICAL VAPOR DEPOSITION CHAMBER

CROSS-REFERENCE TO RELATED APPLICATIONS

This non-provisional application for a patent is a continuation of the provisional application for a patent entitled "HOT FILAMENT CHEMICAL VAPOR DEPOSITION CHAMBER AND METHOD OF USE" filed on Aug. 30, 1999 by the inventor, Zhidan L. Tolt and granted U.S. Serial No. 60/151,420. This non-provisional application relates to two non-provisional applications filed Feb. 23, 2000 by inventor, Zhidan L. Tolt, entitled A Substrate Support for Use in a Hot Filament Chemical Vapor Deposition Chamber, Ser. No. 09/511,572, and A Heating Element for Use in a Hot Filament Chemical Vapor Deposition Chamber, Ser. No. 09/511,021.

TECHNICAL FIELD

This invention relates to the chemical vapor deposition of diamond or carbon films, and more particularly, to an apparatus and a method of use in such deposition.

BACKGROUND INFORMATION

One class of methods developed in recent years for carbon deposition consists of the chemical vapor deposition ("CVD") methods. For a general summary of various deposition methods including CVD methods, reference is made to Chemical & Engineering News, 67(20), 24–39 (May 15, 1989), incorporated herein by reference.

In the CVD methods, a mixture of hydrogen and a hydrocarbon gas such as methane is introduced into a chamber and is then heated or thermally activated. Some of the hydrogen gas is disassociated into atomic hydrogen which reacts with the hydrocarbon to form growth species. These species deposit on the substrate in the form of a carbon film when they come into contact with a cooler substrate. This process is schematically illustrated in FIG. 1.

One of the many of the CVD coating methods, hereinafter referred to as "filament" methods, employ one or more resistance heating units including heated wires or filaments, typically at temperatures of at least 2000° C. to provide the high activation temperatures at which these disassociations take place. This method is known in the art as hot filament assisted chemical vapor deposition ("HFCVD").

Many reaction and mass transport processes occur on the substrate surface. The substrate temperature is therefore crucial to optimize growth of the film.

The integrity of the resistance heating filaments is critical in achieving and maintaining uniform temperature during the deposition. If a heating filament sags, the temperature in the vicinity of the heating element differs, thereby creating thermal and species nonuniformity on the substrate. If filaments break frequently, maintenance is needed more often. The condition and position of heating elements is therefore a critical factor for reactor operation. Resistance heating filaments are delicate and are easily broken during operation of the reactor. They expand when heated from room temperature to an operating temperature of 2000° C. and are thus subject to thermally-induced stresses that can break the filaments. Also, during carbon deposition, resistance heating filaments can react with carbon-bearing gases contacting the filaments and form a carbide, further lengthening and embrittling the filaments.

Horizontal filaments which are typically used in HFCVDs present a number of problems. The filaments severely deform and sag after they are first heated up so that uniform and repeatable film deposition become impracticable. As a result, intense maintenance work becomes necessary and makes it impractical to use most conventional HFCVD reactors for manufacturing purposes.

Because of tremendous thermal gradients present in a hot filament reactor, a large ceramic substrate plate breaks easily. For large area deposition, a uniform gas distribution is also necessary to achieve uniform deposition. It is thus important to be able to control the temperature of the substrate. Furthermore, graphitic carbon on non-substrate (i.e., the elements of the reactor) accumulates in HFCVD reactors. This accumulation requires frequent removal resulting in higher maintenance costs.

What is needed, therefore, is a device that can maintain a substantially constant force on the filaments to eliminate sagging of the filaments. Preferably, such a device would minimize maintenance and equipment set-up between cycles of operation. What is also needed is a device to control the gas flow. Preferably, such a device would also control the deposition of the carbon on the substrate and control the temperature of the substrate to prevent breakage of the substrate. Furthermore, a preferred device would also result in reduced maintenance costs by minimizing carbon accumulation.

SUMMARY OF THE INVENTION

The previously mentioned needs are fulfilled with the present invention. Accordingly, there is provided, in a first form, a disclosed CVD reactor which substantially reduces or eliminates the disadvantages and shortcomings associated with the prior art techniques.

To prevent filament sagging, the filaments in the present invention are arranged in the reactor vertically instead of the typical horizontal configuration. The filament assembly is configured such that the lower end of each filament can freely contract or extend vertically while constrained in all other directions.

The reactant gas is introduced into the reactor chamber through a gas dispersion system. The gas dispersion system, mounted within the reactor chamber, has a configuration to introduce the gas into three separate feeding zones. Each feeding zone has an independent control of the gas feeding rate. The extent of radial gas flow in the reactor, therefore, is controlled. Thus, the typical nonuniform distribution of gas is reduced by utilizing a three-zone feed gas distribution so that a uniform deposit of material can be achieved over the entire surface of the substrate.

A substrate support is mounted within the reactor chamber. During the operation of the reactor, the substrate support continually rotates 180 degrees back and forth. This constant rotation also helps ensure a uniform distribution of the carbon onto the surface of the substrate.

To prevent substrate breakage, there is also a feature to preheat the substrate before the actual deposition process is started. This preheating reduces the thermal gradient created by the filaments. There is also provided a means to cool the substrate holder when the reactor is fully operational. This cooling mechanism allows the user to independently control the temperature of the substrate.

Furthermore, the filament support structure and other relatively hot surfaces inside the reactor are water-cooled so that little, if any, graphitic carbon can accumulate on these surfaces. Thus, maintenance costs due to this accumulation are greatly reduced.

These and other features, and advantages, will be more clearly understood from the following detailed description taken in conjunction with the accompanying drawings. It is important to note the drawings are not intended to represent the only form of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 7 is a detail plan view illustrating the configuration of a substrate support cooling system of one embodiment of the present invention.

DETAILED DESCRIPTION OF THE INVENTION

The principles of the present invention and their advantages are best understood by referring to the illustrated embodiment depicted in FIGS. 2–8 of the drawings, in which like numbers designate like parts. In the following description, well-known elements are presented without detailed description in order not to obscure the present invention in unnecessary detail. For the most part, details unnecessary to obtain a complete understanding of the present invention have been omitted inasmuch as such details are within the skills of persons of ordinary skill in the relevant art. Details regarding control circuitry or mechanisms used to control the rotation of the various elements described herein are omitted, as such control circuits are within the skills of persons of ordinary skill in the relevant art.

Figure 1:
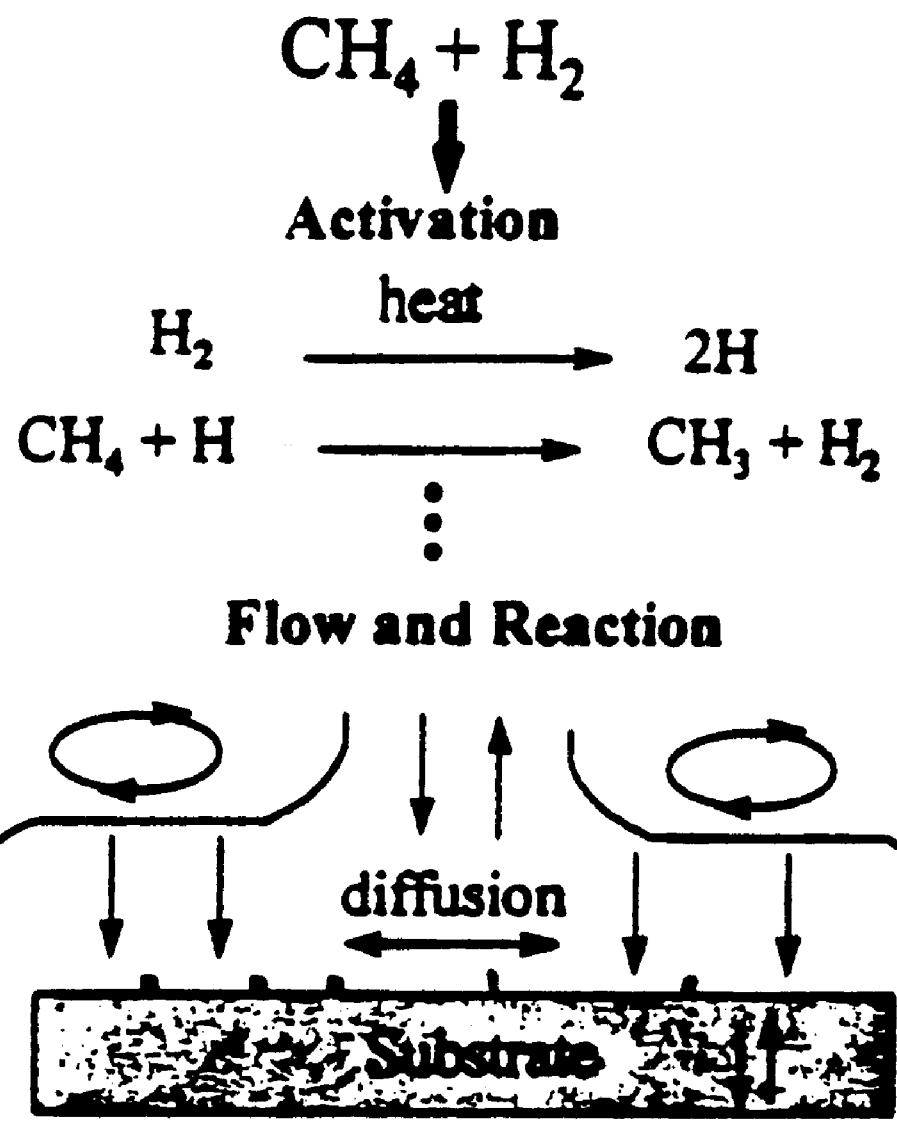
FIG. 1 is a schematic view showing the chemical reactions and processes of a typical hot filament vapor deposition process.
Figure 2:
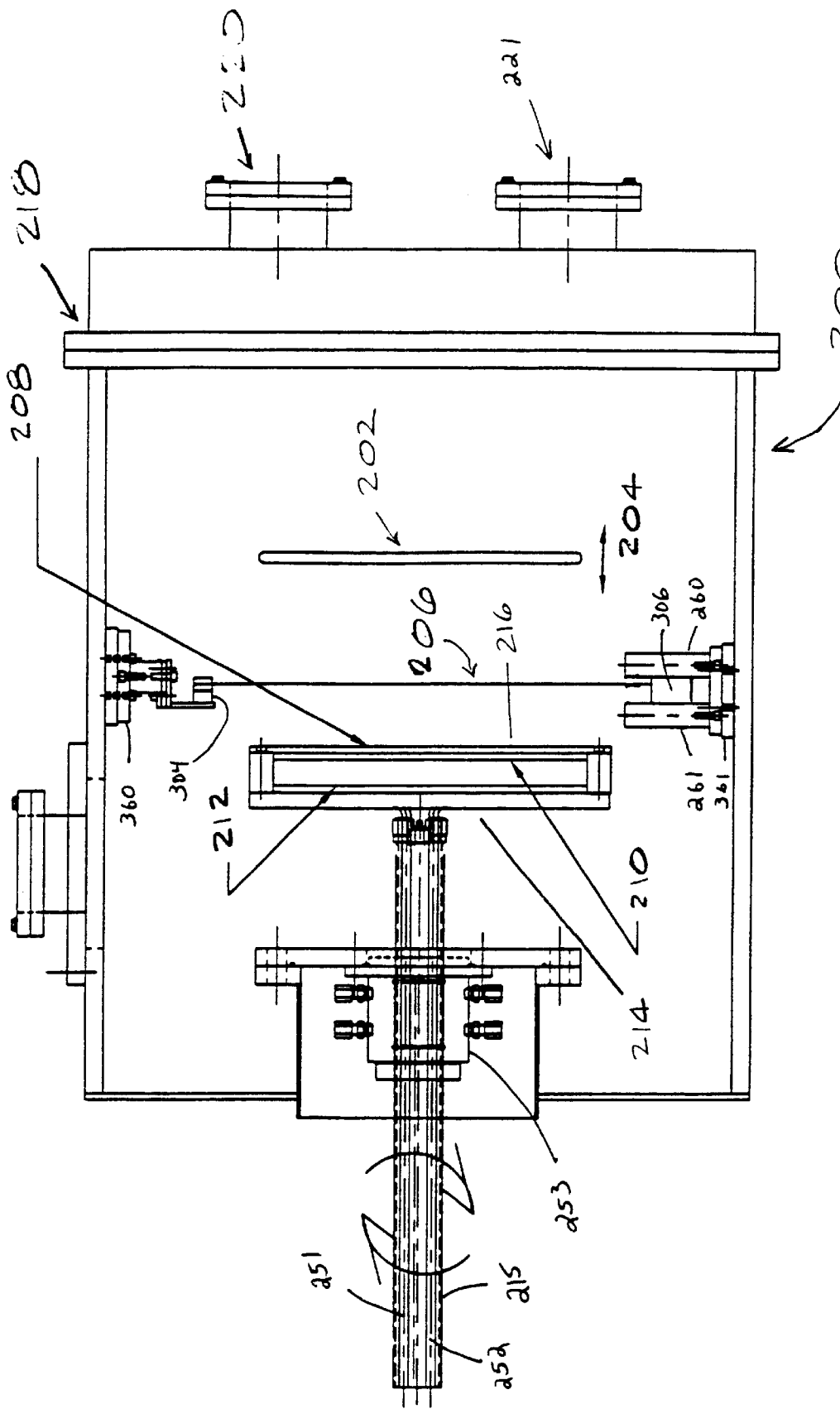
FIG. 2 is a side-sectional view of the chamber illustrating one embodiment of the present invention.

Referring now to FIG. 2, there is depicted a side view of reaction chamber 200 showing the interior features of reaction chamber 200 of the HFCVD reactor according to the present invention. Chamber 200 is the housing where the chemical reactions and depositions occur. All of the features disclosed in the present invention are enclosed in reaction chamber 200 which is air-tight and thus capable of being maintained at reduced pressure and is fitted with a suitable gas inlet and an exhaust port (not shown). All portions of the apparatus which are present in the reaction chamber 200 are constructed of suitable heat-resistant materials, as necessary to withstand high temperatures. Stainless steel is an illustrative heat-resistant material suitable for this purpose.

FIG. 2 is a simplified sectional view of the HFCVD reactor 200 according to the present invention. In the following description of the invention, the reactor 200 is oriented horizontally and gas flow is from right to left. However, this does not imply that the invention is limited to this arrangement of flow. Vertical upward flow, and in some cases vertical downward flow, are included as embodiments of the present invention.

The key elements of the improved HFCVD reactor 200 comprise a multi-zone gas dispersion system 202 (see FIG. 4), a filament array 206 (see FIG. 3), a rotating substrate holder 208, a substrate cooling system 212, and a substrate heater 210. Gas dispersion system 202 and substrate holder 208 are oriented within the reactor so that their surfaces are perpendicular to the axis of the gas flow through the reaction zone. The substrate 216 to be coated is supported by substrate holder 208 which rests on substrate heater 210. Under substrate heater 210 is substrate cooler 212 which is mounted to substrate holder base 214. Substrate heater 210 is provided with a lead (not shown) to which an electrical heating current is conducted from a suitable external power source (not shown). Substrate holder 208 is also provided with a thermocouple (not shown) to measure substrate temperature and a connecting electrical lead (not shown) through which the thermocouple output may be transmitted to an external indicator or read-out (not shown).

Substrate holder base 214 is connected to turning axle 215, which is hollow to permit the passage of fluid conduits 251 and 252, which will pass the cooling fluid for substrate cooler 212, along with the electrical lead (not shown) for the thermal couple (not shown) and the substrate heater 210. Motor 253 turns axle 215, resulting in the turning of the substrate 208. This is performed in a back-and-forth motion where the substrate is rotated 180° clockwise and then returned 180° counterclockwise. Note that a lateral displacement of the substrate holder is also permitted.

Chamber 200 also includes view ports 220 and 221 for looking at the internal contents of the chamber 200. Additionally, chamber 200 includes the hinged lid 218, which can be opened to access the internal components of chamber 200, Label 204 indicates that the gas dispersion system 202 can be moved back-and-forth to be closer or farther away from the substrate 208. The remainder of the components noted in FIG. 2 are discussed in further detail with respect to FIGS. 3–7.

Figure 3:
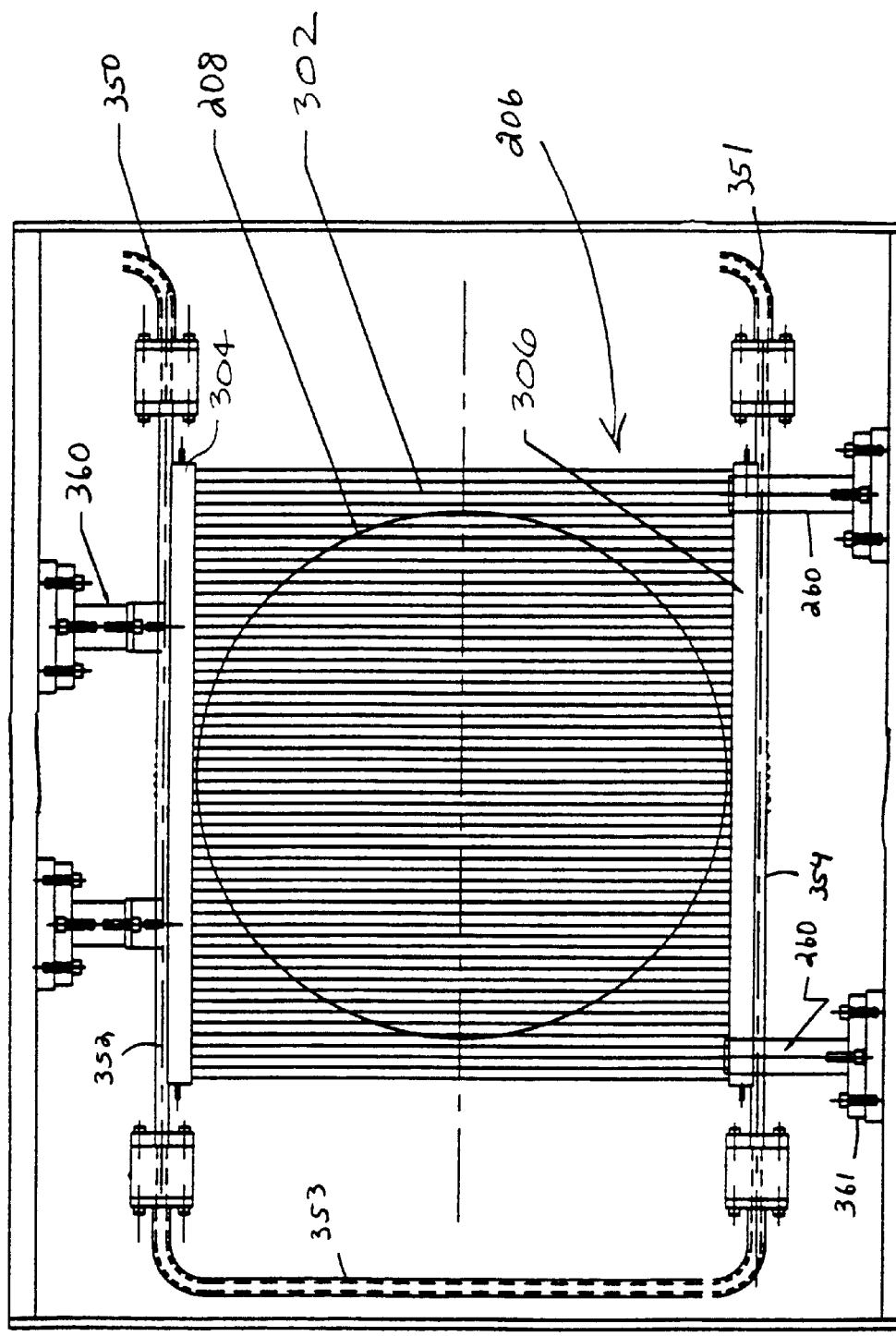
FIG. 3 is a cross-sectional view of the chamber illustrating the filament configuration of one embodiment of the present invention.

FIG. 3 illustrates the vertical array 206 of heating filaments 302. Filaments 302 are made of a material that heats upon passing an electrical current through it. Means for applying an electrical current are connected to electrodes 304 and 306. Illustrative materials are metallic tungsten, tantalum, molybdenum, and rhenium, with tungsten being preferred. Although the embodiment in FIG. 3 shows preferred vertical filaments 302, several features of the embodiments of this invention are also applicable to a reactor which utilizes horizontal filaments instead of or in addition to the vertical filaments.

Resistance heating filaments 302 are of approximately the same length as the other filaments and are attached to two electrodes (filament bars) 304 and 306 to form the array of filaments 206. The top electrode 304 has its position fixed for reactor operation.

Electrode 306 is also connected to filaments 302. However, as more clearly illustrated in FIG. 2, electrode 306 is permitted to slide between positioning posts 260 and 261, which are affixed to the chamber 200 wall by base 361. Base 360 affixes electrode 304 to the chamber wall also. Positioning posts 260 and 261 are made of a material, such as a ceramic, which is not only insulative, but also has a surface that permits the slidable movement of electrode 306 in a vertical direction as the filaments 302 lengthen from heat and carbonization, or shorten as they are cooled. This alleviates the longitudinal stress upon the filaments 302 as the temperature in the chamber 200 changes.

Cooling of the electrodes 304 and 306 is provided by the cooling fluid passing through conduits 352–354, which pass the cooling fluid from flexible tubing tubings 350 and 351, which receive and send the cooling fluid to and from a source external to the chamber 200.

During operation, filaments grow from carburization and from thermal expansion. The gravity force on the movable electrode maintains the filaments taut. The movable electrode of the array is also preferably so designed that it rigidly clamps its filaments' ends, thereby preventing substantial vibration of the filaments at the spring end. For vertical filaments, it is preferable to provide guide tracks on each end of the movable electrode to prevent unwanted spiraling and bouncing of the movable electrode and filaments that could be caused by the flow of hot gases around the filaments and movable electrode.

A conventional HFCVD reactor design utilizes a flat rectangular or circular substrate holder over which a small substrate is placed for CVD coating. The gas flow adjacent to the substrate surface is therefore generally radial outward from a stagnation point, resulting in non-uniform deposition.

Figure 4:
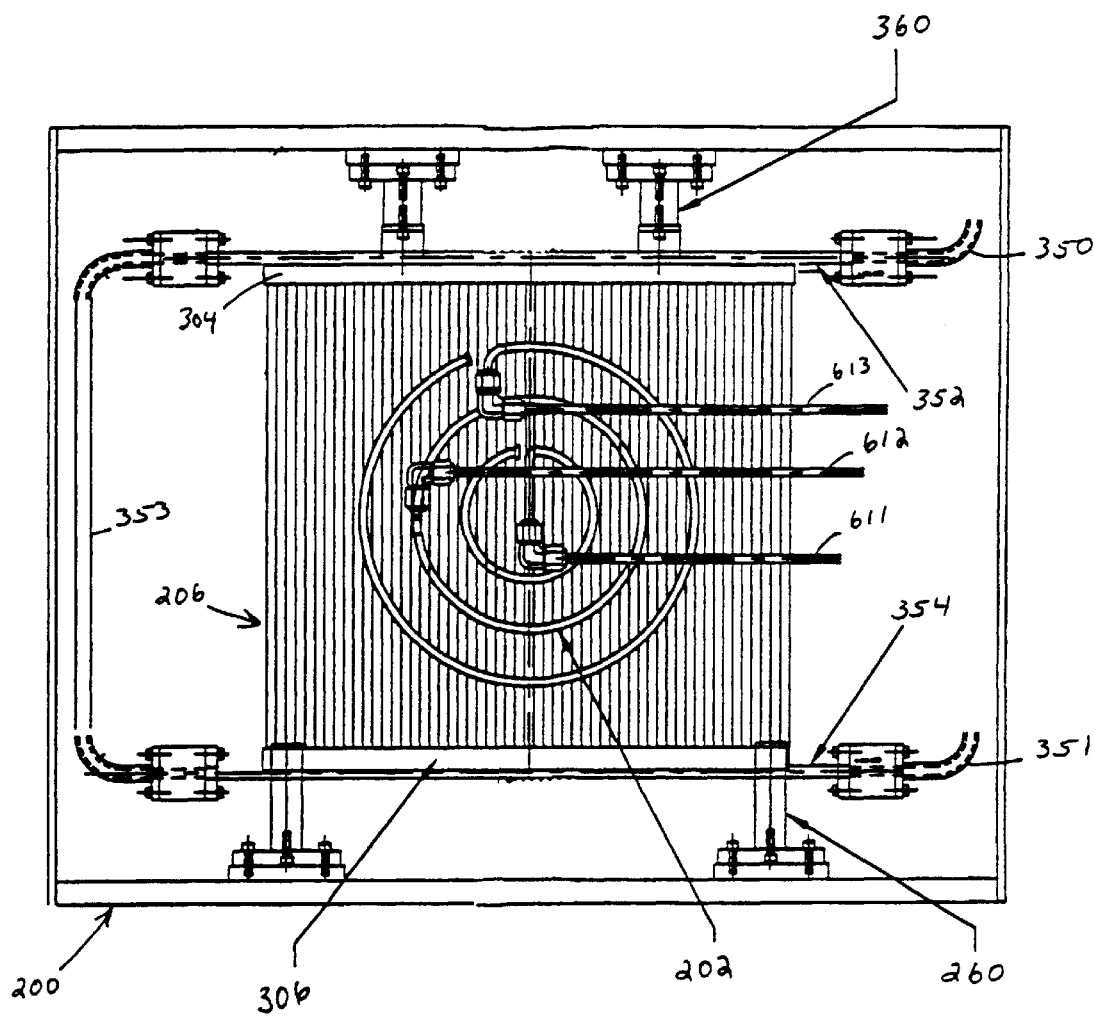
FIG. 4 is another cross-sectional view of the chamber illustrating the gas dispersion configuration of one embodiment of the present invention.
Figure 6:
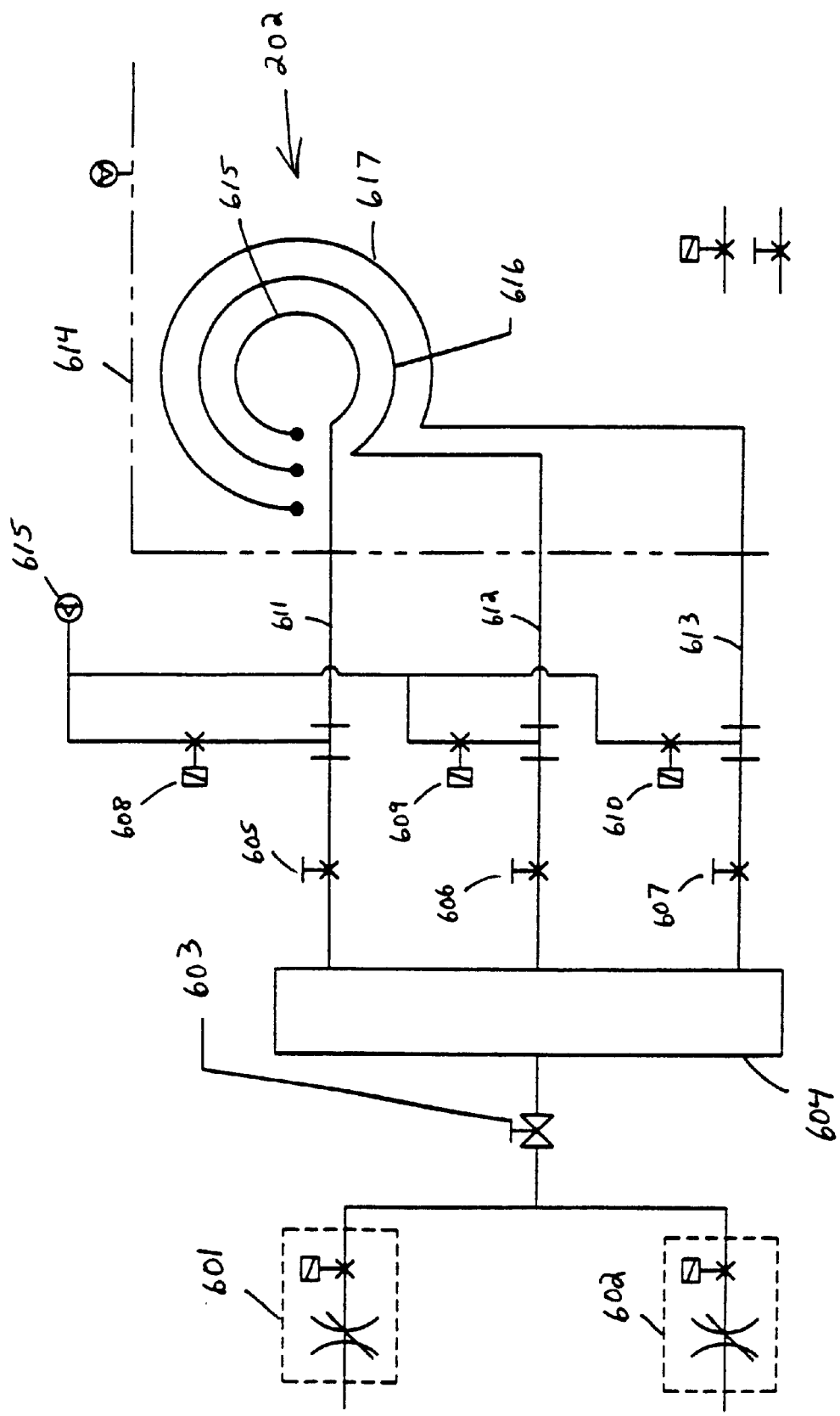
FIG. 6 is a schematic view of the operational aspects of the gas dispersion system illustrated in FIG. 4.

FIG. 4 illustrates the gas dispersion system 202 whereby three separate feedlines 611–613 supply the reaction mixture of gases in three separate zones further depicted in FIG. 6. These three zones are labeled as 615, 616 and 617, which zones are concentric. Each of the pipes associated with each zone are perforated for expulsion of the gas towards the substrate in their respective zones.

Gas is fed to a mixing chamber 604 through a valve 603 from a gas source or reservoir 601–602. The mixed gas is then passed through needle valves 605–607 to the respective gas feedlines 611–613 to zones 615–617, respectively, which lie within the chamber. The barometric pressure can be measured at gauge 615 through open/close valves 608–610 individually for each gas feedline 611–613. The needle valves fine control the flow rate of each line to the different zones of the reactor to optimize the gas distribution. The shape of the gas dispersion elements or perforated tubes can be different for different substrate geometries. As described above, the distance between the perforated gas line assembly and the filaments is also adjustable.

Figure 5:
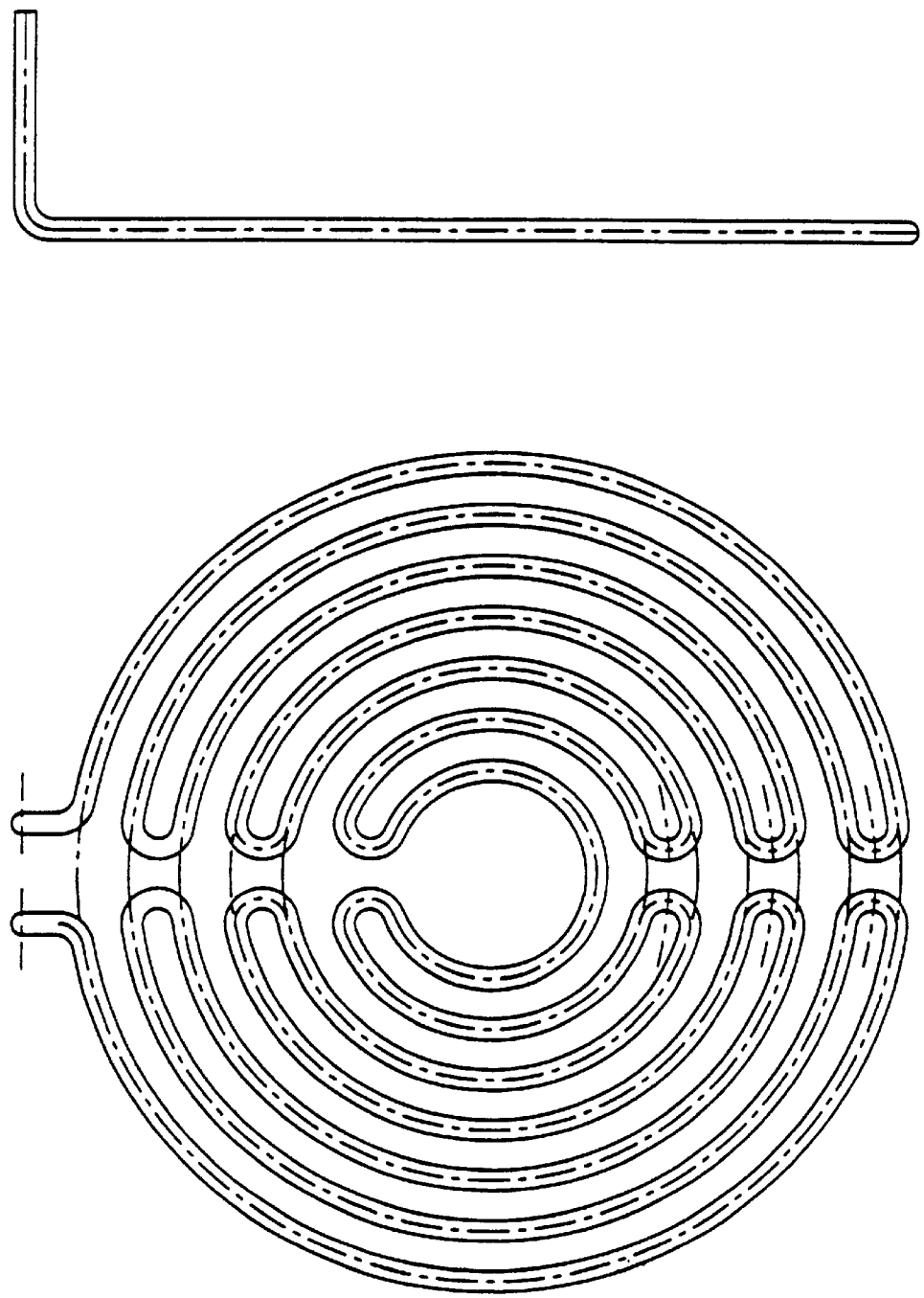
FIG. 5 is a detail plan view illustrating the configuration of a substrate heating system of one embodiment of the present invention.

FIGS. 5 and 7 illustrate front and side views of cooling tubing configurations for the substrate cooler 212, whereby the cooling fluid is passed to either one of these types of configurations for cooling the substrate.

In operation, the reaction chamber 200 is maintained at a pressure up to about 760 torr, typically on the order of 10 torr. A mixture of hydrogen and a hydrocarbon, most often methane is passed into the chamber 200 and a current is passed through the electrodes 304, 306 and filaments 302 to heat the filaments 302 to a temperature of at least about 2000° C.

The heat sink(s) is maintained at a distance from the substrate and water passage through the tubing associated therewith is maintained at a rate to provide a substrate temperature in the range of about 800–1000° C., depending on the desired film structure and growth rate.

During the CVD operation, filaments 302 undergo thermal expansion and expansion due to carburization. By reason of their prestressed condition, however, such expansion merely causes them to lengthen. Thus, they are not prone to distort in other directions or break. Using this combination of elements, the filaments will have a longer life span.

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It is therefore, contemplated that the claims will cover any such modifications or embodiments that fall within the true scope of the invention.

What is claimed:

1. A gas dispersion apparatus for use in a reactor comprising:
   at least one gas source;
   at least two gas dispersion elements positioned proximate a filament array and a substrate, each said gas dispersion element forming an independent discharged gas zone directed at said substrate; and
   each said gas dispersion element connected to said gas source by a gas feedline wherein gas flow can be independently controlled to each said gas dispersion element and gas zone formed thereby.

2. The apparatus of claim 1 wherein said gas dispersion elements are aligned to substantially form a plane.

3. The apparatus of claim 2 wherein each said gas dispersion element is moveable in relation to said substrate.

4. The apparatus of claim 3 wherein each said gas dispersion element comprises a closed end conduit having a plurality of discharge orifices directed toward said substrate.

5. The apparatus of claim 2 wherein each said gas dispersion element comprises a closed end conduit having a plurality of discharge orifices directed toward said substrate.

6. The apparatus of claim 1 wherein each said gas dispersion element is moveable in relation to said substrate.

7. The apparatus of claim 6 wherein each said gas dispersion element comprises a closed end conduit having a plurality of discharge orifices directed toward said substrate.

8. The apparatus of claim 1 wherein each said gas dispersion element comprises a closed end conduit having a plurality of discharge orifices directed toward said substrate.

9. The apparatus of claim 1 wherein each said gas dispersion element forms a substantially concentric conduit having gas discharge orifices directed toward said substrate.

10. The apparatus of claim 9 wherein said gas dispersion elements are aligned to substantially form a plane.

11. The apparatus of claim 10 wherein each said gas dispersion element is moveable in relation to said substrate.

12. The apparatus of claim 9 wherein each said gas dispersion element is moveable in relation to said substrate.

13. A gas dispersion apparatus for use in a reactor comprising:
   at least one gas source;
   at least two gas dispersion elements positioned proximate a filament array and a substrate, each said gas dispersion element comprising a substantially concentric conduit having gas discharge orifices directed toward said substrate forming independent discharged gas zones directed at said substrate; and
   each said gas dispersion element connected to said gas source by a gas feedline wherein gas flow can be independently controlled to each said gas dispersion element and gas zone formed thereby.

14. The apparatus of claim 13 wherein said gas dispersion elements are aligned to substantially form a plane.

15. The apparatus of claim 14 wherein each said gas dispersion element is moveable in relation to said substrate.

16. The apparatus of claim 13 wherein each said gas dispersion element is moveable in relation to said substrate.

17. A gas dispersion apparatus for use in a reactor comprising:

at least one gas source;

three gas dispersion elements positioned proximate a filament array and a substrate, each said gas dispersion element comprising a substantially concentric conduit having gas discharge orifices directed toward said substrate forming an independent discharged gas zone directed at said substrate;

said gas dispersion elements being aligned to form a plane;

said gas dispersion elements being moveable in relation to said substrate; and each said gas dispersion element connected to said gas source by a gas feedline wherein gas flow can be independently controlled to each said gas dispersion element and gas zone formed thereby.

* * * * *